US008445298B2

(12) United States Patent
Takeuchi et al.

(10) Patent No.: US 8,445,298 B2
(45) Date of Patent: May 21, 2013

(54) PROCESS OF PRODUCING LIQUID DISCHARGE HEAD BASE MATERIAL

(75) Inventors: Souta Takeuchi, Yokohama (JP); Masaya Uyama, Kawasaki (JP); Hirokazu Komuro, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 12/871,233

(22) Filed: Aug. 30, 2010

(65) Prior Publication Data

US 2011/0059558 A1 Mar. 10, 2011

(30) Foreign Application Priority Data

Sep. 4, 2009 (JP) ................................ 2009-204640

(51) Int. Cl.
*H01L 21/00* (2006.01)
*H01L 21/50* (2006.01)
*H01L 21/48* (2006.01)
*H01L 21/44* (2006.01)

(52) U.S. Cl.
USPC .............. 438/21; 438/106; 438/667; 438/668

(58) Field of Classification Search
USPC ...................................... 438/21, 50, 667, 668
See application file for complete search history.

(56) References Cited

U.S. PATENT DOCUMENTS

| | | | | | |
|---|---|---|---|---|---|
| 5,694,684 | A * | 12/1997 | Yamamoto | 29/890.1 |
| 7,926,909 | B2 * | 4/2011 | Hayakawa et al. | 347/44 |
| 2008/0165222 | A1 | 7/2008 | Hayakawa | |

FOREIGN PATENT DOCUMENTS

| | | | |
|---|---|---|---|
| CN | 1976811 | A | 6/2007 |
| JP | 05-147223 | A | 6/1993 |
| JP | 6-312509 | A | 11/1994 |
| JP | 2009-132133 | A | 6/2009 |

* cited by examiner

*Primary Examiner* — Luan C Thai

(74) *Attorney, Agent, or Firm* — Canon U.S.A., Inc. IP Division

(57) ABSTRACT

A process includes preparing a base material having a first surface provided with an element generating energy that is used for discharging a liquid and an electrode layer that is connected to the element; forming a hollow on a second surface, which is the surface on the opposite side of the first surface, of the base material, wherein part of the electrode layer serves as the bottom face of the hollow; covering the surface of the base material and the bottom face forming the inner face of the hollow with an insulating film; and partially exposing the electrode layer by removing part of the insulating film covering the bottom face using laser light.

20 Claims, 6 Drawing Sheets

PROCESS OF PRODUCING LIQUID DISCHARGE HEAD BASE MATERIAL

BACKGROUND OF THE INVENTION

1. Field of the Invention

The present invention relates to a liquid discharge head base material that is used in a liquid discharge head discharging a liquid.

2. Description of the Related Art

As a typical example of liquid discharge heads for discharging liquids, it is known an ink-jet recording system that conducts image recording by discharging an ink from a discharge port as droplets using energy generated by an energy-generating element and making the ink adhere to a recording medium such as paper.

U.S. Patent Publication No. 2008/0165222 discloses the following method of producing an ink-jet recording head base material.

In this method, a hollow is formed in a base material by digging the base material from the back surface of a silicon base material that is provided with an energy-generating element on its front surface side, an insulating film is formed over the entire inner wall of the hollow, and a through electrode that passes through the base material and is electrically connected to the element is formed in the hollow so as to be in contact with the film. The through electrode and the silicon base material are insulated from each other with the insulating film. Furthermore, in the method, an etching mask is formed from a resist by a photolithography technique, and an opening for accessing the through electrode to the front surface side of the base material is formed by removing the insulating film only at a portion corresponding to the bottom of the hollow.

However, when the aspect ratio of the hollow to which the through electrode is provided is large (the ratio of the depth to the diameter is large), it is thought that it is difficult to form an etching resist at high precision by processing a resist in the hollow by photolithography. When the resist is not processed at high precision, an insulating film may not have a desired shape, and a liquid discharge head may not be provided with desired electric characteristics.

SUMMARY OF THE INVENTION

According to an aspect of the present invention a process includes preparing a base material having a first surface provided with an element generating energy that is used for discharging a liquid and an electrode layer that is electrically connected to the element; forming a hollow on a second surface, which is the surface on an opposite side of the first surface, wherein part of the electrode layer serves as a bottom face of the hollow; covering an inner face and the bottom face of the hollow with an insulating film; partially exposing the electrode layer by removing part of the insulating film covering the bottom face using laser light; and forming an electrode passing through from the first surface to the second surface of the base material so as to be electrically connected to the exposed portion of the electrode layer.

Further features of the present invention will become apparent from the following description of exemplary embodiments with reference to the attached drawings.

DESCRIPTION OF THE EMBODIMENTS

Embodiments of the present invention will now be described with reference to the drawings. An ink-jet recording head base material will be described as an example of the liquid discharge head base material of the present invention.

Figure 6:
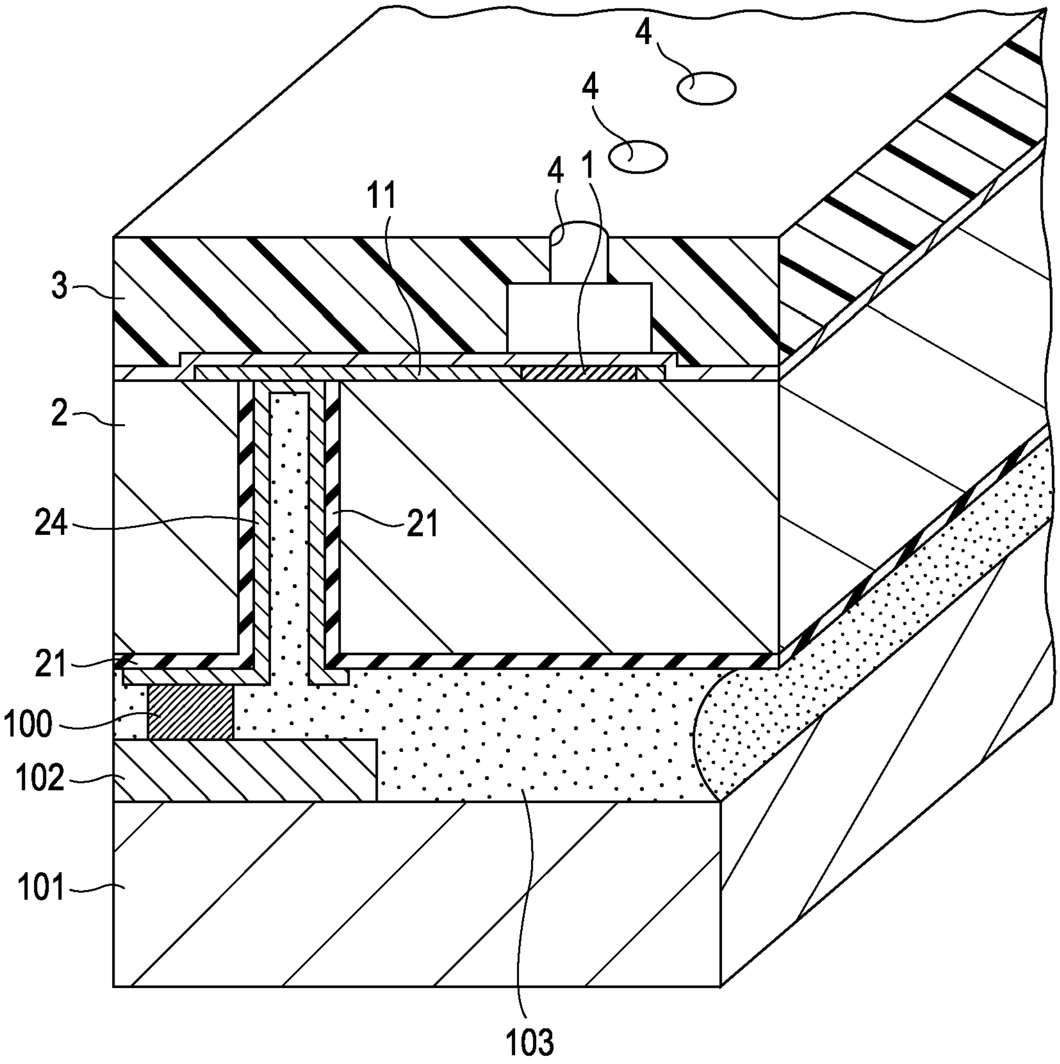
FIG. 6 is a cross-sectional view schematically illustrating a head assembly loaded with an ink-jet head base material of an embodiment according to the present invention.

FIG. 6 is a cross-sectional view illustrating a head assembled with an ink-jet recording head base material produced by the process of producing an ink-jet recording head base material of the present invention.

An ink-jet recording head conducts printing by discharging an ink (also referred to as recording liquid) from an ink discharge port 4 by energy generated by an energy-generating element 1 and making the ink adhere to a recording medium.

The ink-jet recording head base material includes a silicon base material 2 and the energy-generating element 1 disposed on the base material 2 and generating energy to be used for discharging an ink. The ink-jet recording head base material further includes a wiring layer 11 serving as a first electrode layer that is driving circuit wiring for the energy-generating element 1, a through electrode 24 passing through the base material 2 and supplying an electric signal to the wiring layer 11, and an insulating layer 21 of the through electrode 24. The through electrode 24 is provided to the back surface and the inside of the base material 2, and the driving circuit wiring 11 is provided to the front surface side of the base material 2 as a wiring layer. The through electrode 24 passes through the base material 2 and is electrically connected to an electrical connection terminal 100 of electric wiring 102 on the back surface side of the base material 2. Furthermore, the through electrode 24 is sealed with a sealing member 103. The electric wiring 102 is supported by a supporting member 101 such as alumina.

First Embodiment

A process of producing an ink-jet recording head base material according to a first Embodiment will be described below.

Figure 2A:
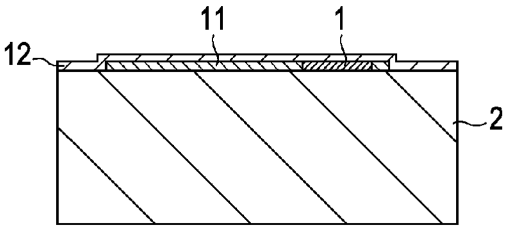
FIG. 2A is a cross-sectional view schematically illustrating a production process according to a first Embodiment.

As shown in FIG. 2A, an energy-generating element 1 and a wiring layer 11 as a first electrode layer serving as driving circuit wiring are formed on a silicon base material 2 by multilayer wiring technology using photolithography, and an inorganic protective film 12 is formed thereon. The material of the wiring layer 11 may be any electrically conductive metal, and examples thereof include aluminum, copper, gold, and alloys thereof. For example, the wiring layer 11 can be formed of a metal containing aluminum. Thus, the silicon base material 2 having a first surface side provided with the energy-generating element 1 for generating energy to be used for discharging an ink and the first electrode layer 11 electrically connected to the energy-generating element 1 is prepared.

Figure 2B:
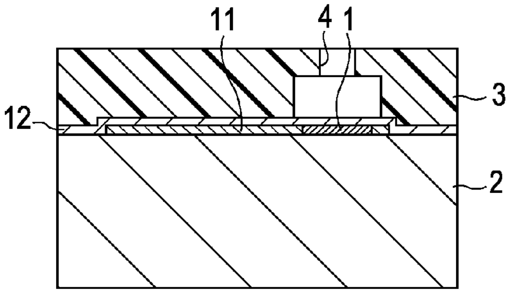
FIG. 2B is a cross-sectional view schematically illustrating the production process according to the first Embodiment.

Then, as shown in FIG. 2B, a discharge port-forming member 3 is formed by application of a cationic polymerizable epoxy resin, and an ink discharge port 4 is formed therein by photolithography.

Figure 2C:
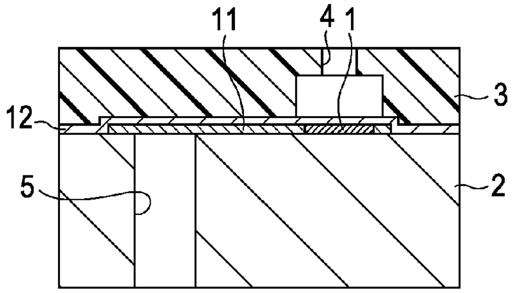
FIG. 2C is a cross-sectional view schematically illustrating the production process according to the first Embodiment.

Then, as shown in FIG. 2C, a hollow 5 is formed in the silicon base material 2 so as to reach the wiring layer 11 from the back surface of the base material by a Deep-RIE method such as a Bosch process.

Figure 2D:
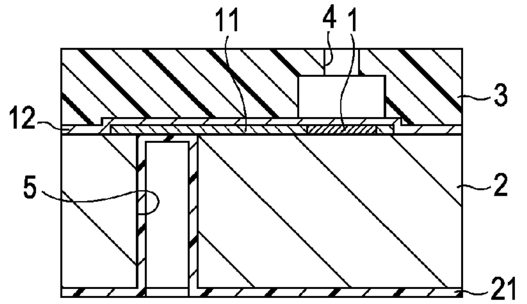
FIG. 2D is a cross-sectional view schematically illustrating the production process according to the first Embodiment.

Then, as shown in FIG. 2D, a protective resin film 21 is formed on the entire back surface of the base material, more specifically, on the back surface of the base material, the side surface of the hollow, and the bottom surface of the hollow, by organic CVD for ensuring ink resistance properties required for the through electrode.

The organic CVD film in the present invention is a resin film formed by organic CVD. The organic CVD is a method for forming a film by evaporating an organic monomer as a raw material or a prepolymer as a polymer precursor thereby to form the film as a polymer on a target.

The organic CVD film formed by the organic CVD is good in adhesiveness and achieves satisfactory coverage even in a hollow with a high aspect ratio (for example, base material thickness: 200 μm, hollow diameter ϕ: 50 μm).

The material of the protective resin film is not particularly limited as long as a protective film can be formed by organic CVD, and examples thereof include epoxy, polyimide, polyamide, polyurea, and polyparaxylylene.

Figure 2E:
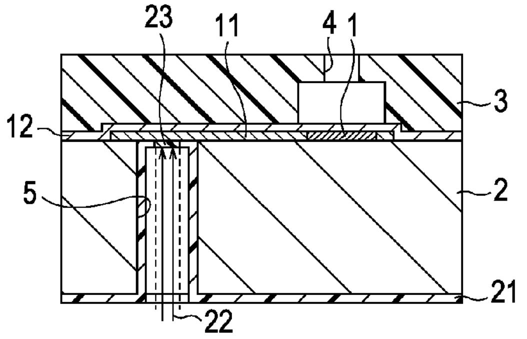
FIG. 2E is a cross-sectional view schematically illustrating the production process according to the first Embodiment.

Then, as shown in FIG. 2E, the protective resin film 23 on the hollow bottom is selectively removed. On this occasion, the protective resin film 23 on the hollow bottom is to be selectively removed, without damaging the back surface of the base material, the protective resin film on the side surface of the hollow, and the wiring layer 5.

Accordingly, as a result of investigation, it has been found that the use of a laser beam can satisfactorily remove the protective resin film on the hollow bottom without damaging the protective resin film on the side surface of the hollow and the wiring layer. In particular, it has been found that when the laser beam is a pulse laser beam having a pulse duration of 1 μs or less or has a wavelength shorter than that of visible light, the protective resin film 23 on the hollow bottom can be removed more safely without damaging the wiring layer, and also the shape of the protective resin film after the removal is sharper and better.

The laser beam in the present invention is not particular limited as long as it can remove the protective resin film, and a pulse laser beam with a pulse duration of 1 μs or less or a laser beam having a wavelength shorter than that of visible light can be used. Furthermore, the laser light can be a pulse laser beam having a pulse duration of 1 μs or less and a wavelength shorter than that of visible light. Examples of such laser light include YAG laser beams generated by yttrium-aluminum-garnet crystals and KrF excimer laser beams generated by discharge in $F_2$ gas and Kr gas. In addition, the wavelength can be 200 to 270 nm.

Figure 1A:
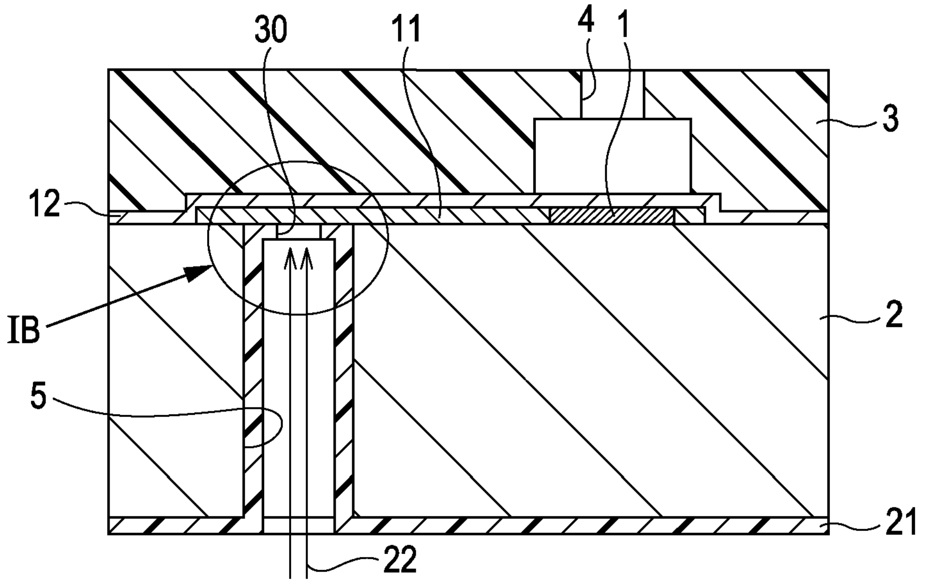
FIG. 1A is a schematic view illustrating a step of removing a resin film covering the bottom of a hollow using a laser.

In this Embodiment, as shown in FIG. 1A, for example, an opening 30 with a diameter of 50 μm can be formed at high precision in the protective film 21 by removing the protective resin film on the hollow bottom using an excimer laser beam (wavelength: 248 nm, pulse width: 30 ns, energy density: 0.6 J/cm$^2$), which is a ultraviolet pulse laser beam.

On this occasion, for example, the protective resin film 21 is a film of polyparaxylylene having a thickness of about 2 μm. In addition, the film of polyparaxylylene can be removed by a desired thickness by adjusting the number of shots of laser beam irradiation. Since polyparaxylylene hardly absorbs long ultraviolet wavelength light, a KrF excimer laser beam (wavelength: 248 nm) or a fourth-order harmonic of a YAG laser beam (wavelength: 266 nm) can be used.

Furthermore, a wiring layer of an electric circuit is disposed on the other side of the protective resin film on the hollow bottom so as to function as a stop layer for laser processing of the protective resin film 21. In this Embodiment, for example, the wiring layer can be an Al—Si layer (thickness: 0.8 μm) formed by sputtering. On this occasion, the electrode layer has a strength against the laser light used in processing larger than that of the insulating film. An alloy of aluminum and silicon can absorb light in the region of 200 to 270 nm and can absorb the KrF excimer laser beam (wavelength: 248 nm) or the fourth-order harmonic of the YAG laser beam (wavelength: 266 nm) used for processing the protective film 21. Consequently, the inorganic protective film 12 as the upper layer and the discharge port member of a resin can be prevented from being damaged by the laser beam.

Figure 1B:
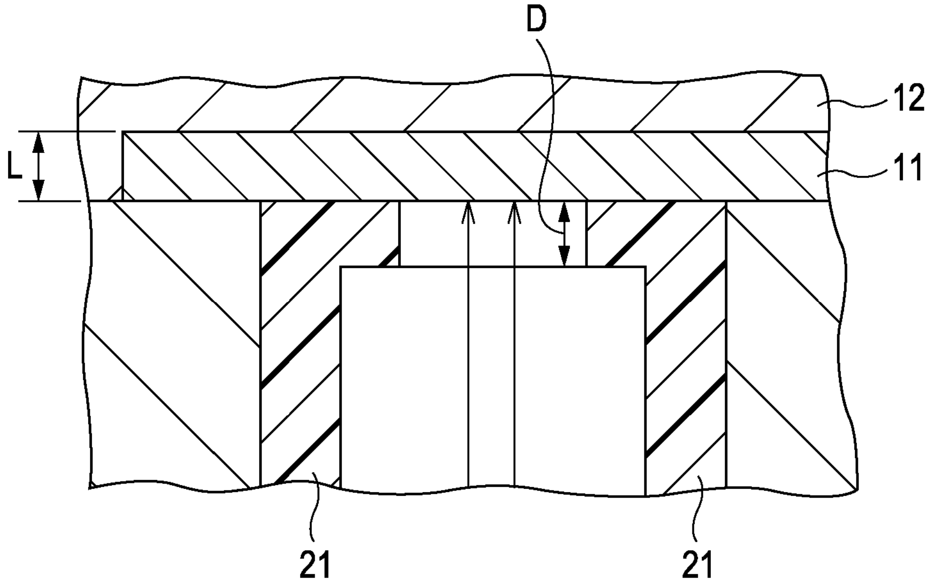
FIG. 1B shows an enlarged view of the section IB of FIG. 1A.

FIG. 1B is an enlarged view of a portion that is irradiated with a laser beam, shown in the section IB of FIG. 1A. In order that the opening 30 will be formed at high precision by processing polyparaxylylene with a KrF excimer laser beam (wavelength: 248 nm) or a fourth-order harmonic of a YAG laser beam (wavelength: 266 nm) and that the Al—Si layer 11 serving as the wiring layer will sufficiently stop the laser beam and satisfactorily function as wiring for transmitting electric power to the energy-generating element, the followings are satisfied: the thickness D of the polyparaxylylene film 21 is 0.5 to 5 μm, and the thickness L of the Al—Si layer 11 is 0.1 to 3 μm.

Figure 2F:
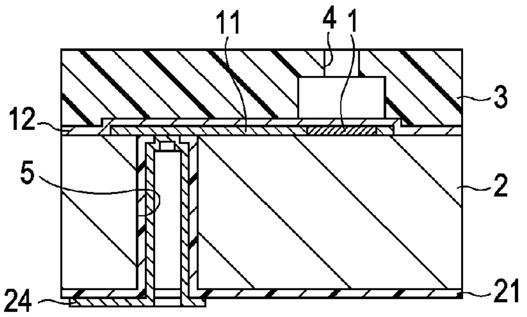
FIG. 2F is a cross-sectional view schematically illustrating the production process according to the first Embodiment.

Then, as shown in FIG. 2F, a metal film serving as an electrically conductive film is formed on the back surface of the base material and the inside of the hollow by vapor deposition, and a through electrode 24 serving as a second electrode layer is formed by patterning.

FIG. 6 is a cross-sectional view schematically illustrating a head assembled with the ink-jet recording head base material having the through electrode produced in this Embodiment. The base material formed as shown in FIGS. 2A to 2F is diced into chips, and the chips are mounted on a chip plate provided with wiring and an electrically conductive land, followed by sealing it to complete the production of the head.

Second Embodiment

As another example, a process of producing an ink-jet recording head base material provided with a through electrode according to a second Embodiment will be described below. Mainly, factors that are different from the first Embodiment will be described.

The second Embodiment is an example that a wiring layer 11 serving as driving circuit wiring is formed on a thermally-oxidized film 13 and has a structure that the element separation in a semiconductor device is achieved by the thermally-oxidized film 13.

Figure 3A:
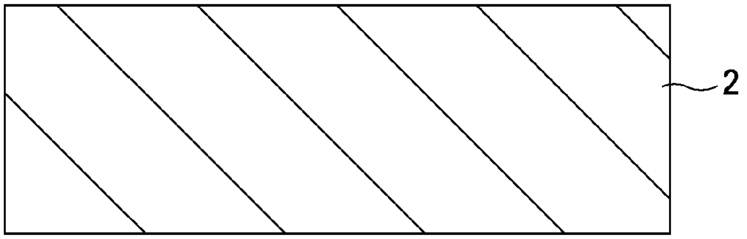
FIG. 3A is a cross-sectional view schematically illustrating a production process according to a second Embodiment.
Figure 3B:
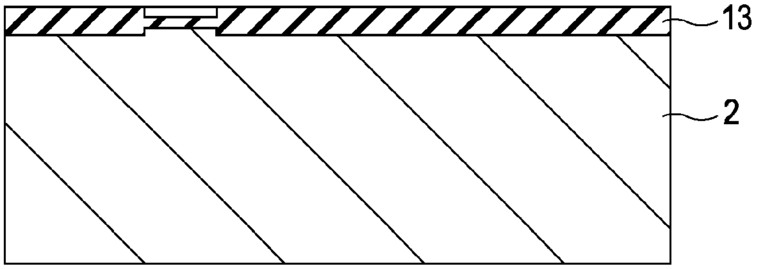
FIG. 3B is a cross-sectional view schematically illustrating the production process according to the second Embodiment.

As shown in FIG. 3B, the thermally-oxidized film 13 serving as an insulating layer is formed on a silicon base material 2 by deposition growth such as thermal CVD. Incidentally, in an actual CVD step, the thermally-oxidized film is formed on each of both surfaces of the silicon base material. However, for simplification of the description, only the thermally-oxidized film on the front surface of the base material will be described.

In advance of the formation of the thermally-oxidized film, as shown in FIG. 3B, the portion where the through electrode is formed can be masked with a silicon nitride film or the like in order to prevent the growth of the thermally-oxidized film.

Figure 3C:
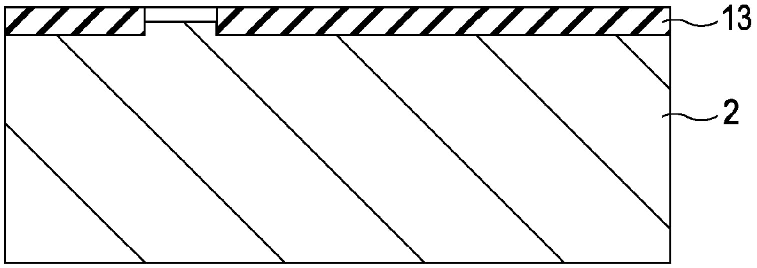
FIG. 3C is a cross-sectional view schematically illustrating the production process according to the second Embodiment.

Since the thermally-oxidized film grows in multiple heating steps for forming a semiconductor element, the thermally-oxidized film is etched immediately before the formation of the wiring layer to completely expose the surface of the silicon base material, as shown in FIG. 3C.

Figure 3D:
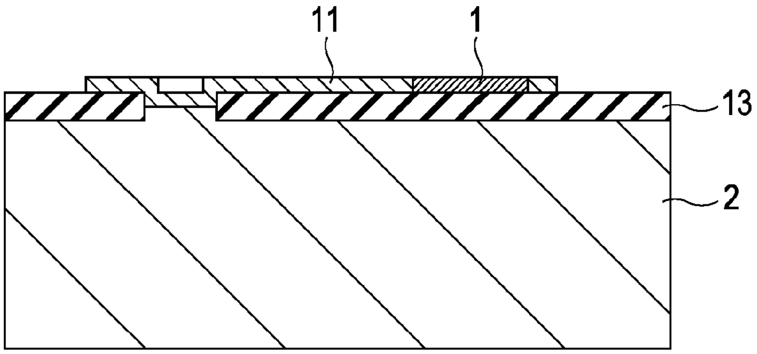
FIG. 3D is a cross-sectional view schematically illustrating the production process according to the second Embodiment.

Then, as shown in FIG. 3D, a wiring layer serving as the driving circuit wiring is formed. The energy-generating element 1 can be formed as in the first Embodiment.

Figure 4A:
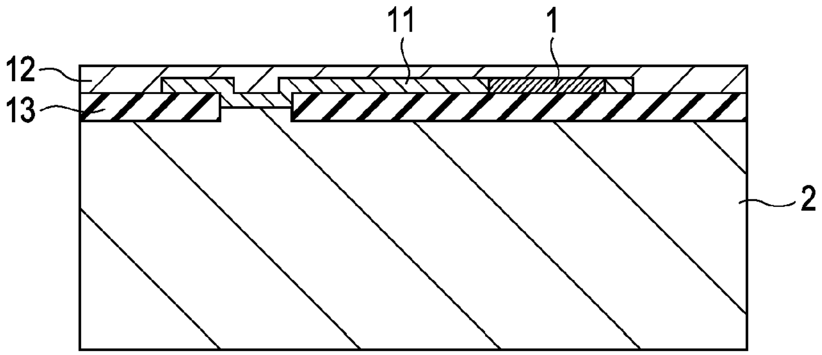
FIG. 4A is a cross-sectional view schematically illustrating the production process according to the second Embodiment.

Then, as shown in FIG. 4A, an inorganic protective film 12 is formed. The inorganic protective film 12 can be formed as in the first Embodiment.

Figure 4B:
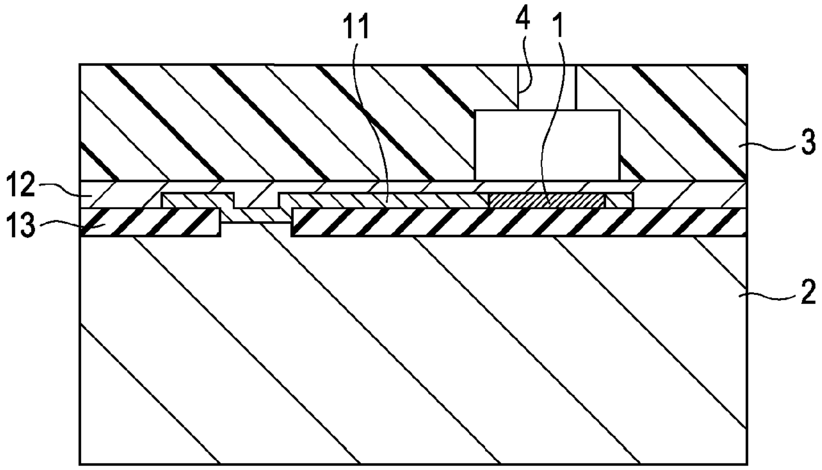
FIG. 4B is a cross-sectional view schematically illustrating the production process according to the second Embodiment.

Then, as shown in FIG. 4B, an ink discharge port 4 is formed as in the first Embodiment by the application of a discharge port-forming member 3.

Figure 4C:
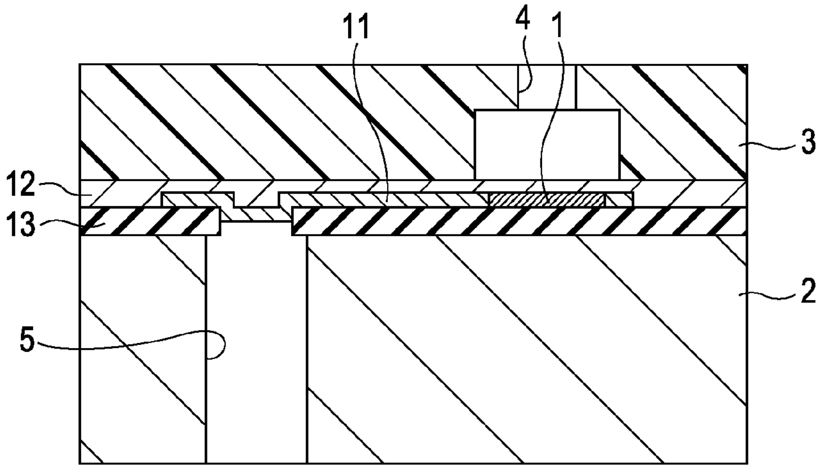
FIG. 4C is a cross-sectional view schematically illustrating the production process according to the second Embodiment.

Then, as shown in FIG. 4C, a hollow 5 is formed from the back surface side of the silicon base material 2 by a Deep-RIE method such as a Bosch process.

On this occasion, the thermally-oxidized film is not etched because of selectivity of the etching gas, and thereby the hollow 5 has the shape shown in FIG. 4C.

Figure 5A:
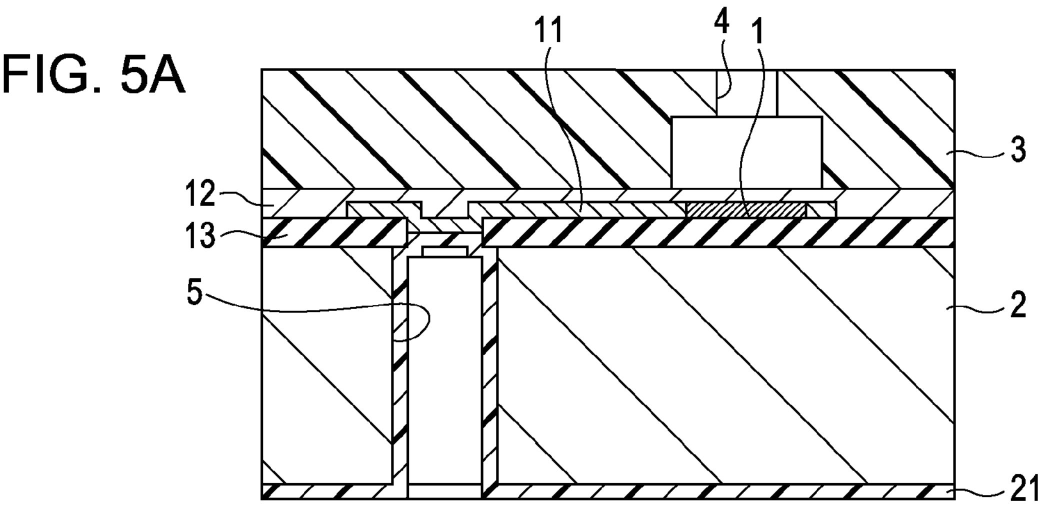
FIG. 5A is a cross-sectional view schematically illustrating the production process according to the second Embodiment.

Then, as shown in FIG. 5A, in order to ensure ink resistance properties required for the through electrode, a protective resin film 21 is formed over the entire back surface of the base material by organic CVD.

In this Embodiment, the hollow has a complicated bottom shape as shown in FIG. 5A.

Figure 5B:
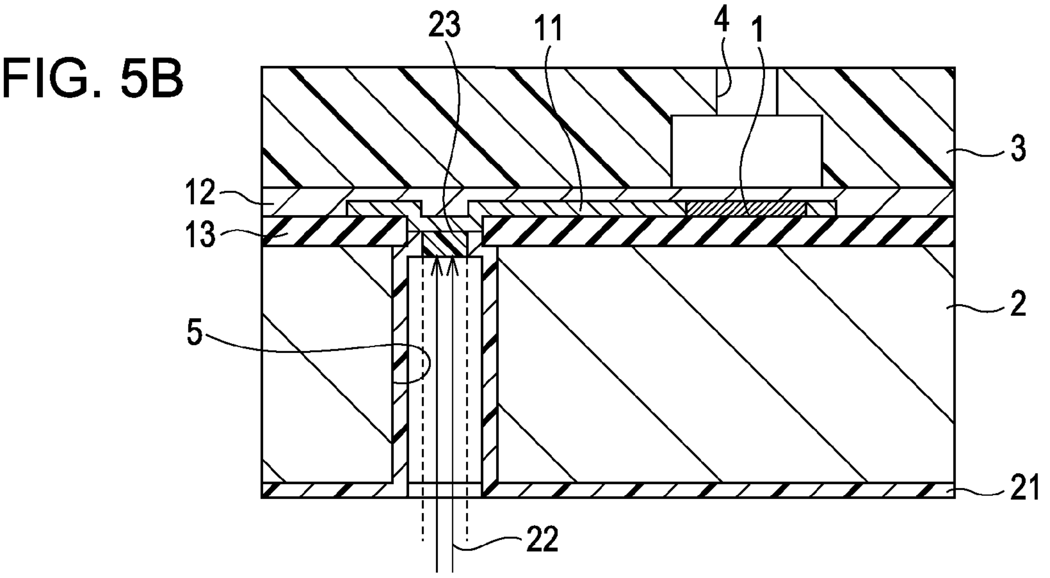
FIG. 5B is a cross-sectional view schematically illustrating the production process according to the second Embodiment.

Then, as shown in FIG. 5B, the protective resin film 23 on the hollow bottom is selectively removed with a laser as in the first Embodiment.

Figure 5C:
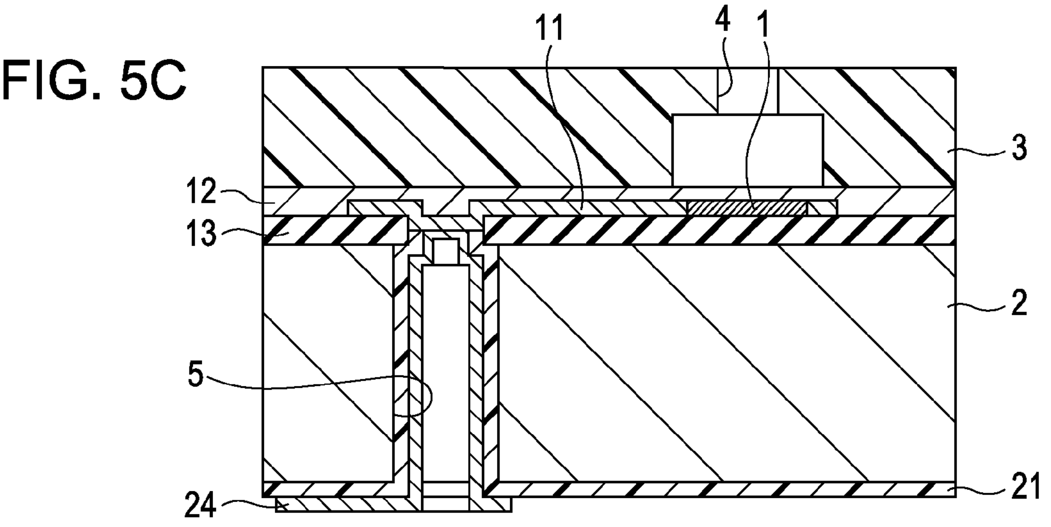
FIG. 5C is a cross-sectional view schematically illustrating the production process according to the second Embodiment.

Then, as shown in FIG. 5C, a metal film serving as an electrically conductive film is formed by vapor deposition, and a through electrode 24 is formed in the inside of the base material by patterning.

The base material formed as shown in from FIG. 3A to FIG. 5C is diced into chips, and the chips are mounted on a chip plate provided with wiring and an electrically conductive land, followed by sealing it to complete the production of a head.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-204640 filed Sept. 4, 2009, which is hereby incorporated by reference herein in its entirety.

What is claimed is:

1. A process comprising:

preparing a base material having a first surface provided with an element generating energy that is used for discharging a liquid and an electrode layer that is connected to the element;

forming a hollow on a second surface, which is a surface on an opposite side of the first surface, wherein part of the electrode layer serves as a bottom face of the hollow;

covering an inner face and the bottom face of the hollow with an insulating film;

irradiating the insulating film with a laser light, with the electrode layer being used as a stop layer for laser, and thereby, partially exposing the electrode layer by removing part of the insulating film covering the bottom face; and forming an electrode passing through from the first surface to the second surface of the base material so as to be connected to the exposed portion of the electrode layer.

2. The process according to claim 1, wherein the electrode layer has a strength against laser light larger than that of the insulating film.

3. The process according to claim 1, wherein the laser light is a pulse laser beam having a pulse duration of 1 μs or less.

4. The process according to claim 1, wherein the laser light is light having a wavelength shorter than that of visible light.

5. The process according to claim 1, wherein the insulating film is made of any material selected from epoxy, polyimide, polyamide, polyurea, and polyparaxylylene.

6. The process according to claim 1, wherein the electrode layer is made of a metal containing at least one selected from aluminum, copper, and gold.

7. The process according to claim 1, wherein the electrode layer is made of an alloy of aluminum and silicon; the insulating film is made of polyparaxylylene; and the laser light is obtained by using an excimer laser beam produced from krypton and fluorine gas.

8. The process according to claim 1, wherein the electrode layer is made of an alloy of aluminum and silicon; the insulating film is made of polyparaxylylene; and the laser light contains light having a wavelength of about 266 nm produced from yttrium-aluminum-garnet.

9. The process according to claim 7, wherein the insulating film made of polyparaxylylene has a thickness between 0.5 μm and 5 μm; and the electrode layer has a thickness between 0.1 μm and 3 μm.

10. The process according to claim 8, wherein the insulating film made of polyparaxylylene has a thickness between 0.5 μm and 5 μm; and the electrode layer has a thickness between 0.1 μm and 3 μm.

11. A process comprising:

preparing a base material having a first surface provided with an element generating energy that is used for discharging a liquid and an electrode layer that is electrically connected to the element;

forming a hollow on a second surface, which is a surface on an opposite side of the first surface, wherein part of the electrode layer serves as a bottom face of the hollow;

covering an inner face and the bottom face of the hollow with an insulating film;

irradiating the insulating film with laser light, with the electrode layer being used as a stop layer for laser, and thereby, partially exposing the electrode layer by removing part of the insulating film covering the bottom face; and forming an electrode passing through from the first surface to the second surface of the base material so as to be electrically connected to the exposed portion of the electrode layer.

12. The process according to claim 11, wherein the electrode layer has a strength against laser light larger than that of the insulating film.

13. The process according to claim 11, wherein the laser light is a pulse laser beam having a pulse duration of 1 μs or less.

14. The process according to claim 11, wherein the laser light is light having a wavelength shorter than that of visible light.

15. The process according to claim 11, wherein the insulating film is made of any material selected from epoxy, polyimide, polyamide, polyurea, and polyparaxylylene.

16. The process according to claim 11, wherein the electrode layer is made of a metal containing at least one selected from aluminum, copper, and gold.

17. The process according to claim 11, wherein the electrode layer is made of an alloy of aluminum and silicon; the insulating film is made of polyparaxylylene; and the laser light is obtained by using an excimer laser beam produced from krypton and fluorine gas.

18. The process according to claim 11, wherein the electrode layer is made of an alloy of aluminum and silicon; the insulating film is made of polyparaxylylene; and the laser light contains light having a wavelength of about 266 nm produced from yttrium-aluminum-garnet.

19. The process according to claim 17, wherein the insulating film made of polyparaxylylene has a thickness between 0.5 μm and 5 m; and the electrode layer has a thickness between 0.1 μm and 3 μm.

20. The process according to claim 18, wherein the insulating film made of polyparaxylylene has a thickness between 0.5 μm and 5 μm; and the electrode layer has a thickness between 0.1 μm and 3 μm.

* * * * *